United States Patent
Lee et al.

(10) Patent No.: US 10,668,511 B2
(45) Date of Patent: Jun. 2, 2020

(54) METHOD OF CLEANING PROCESS CHAMBER

(71) Applicant: Taiwan Semiconductor Manufacturing Co., Ltd., Hsinchu (TW)

(72) Inventors: Tsung-Lin Lee, Tainan (TW); Yi-Ming Lin, Tainan (TW); Chih-Hung Yeh, Tainan (TW); Zi-Yuang Wang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 21 days.

(21) Appl. No.: 15/925,785

(22) Filed: Mar. 20, 2018

(65) Prior Publication Data
US 2019/0291145 A1    Sep. 26, 2019

(51) Int. Cl.
| | | |
|---|---|---|
| *B08B 3/08* | (2006.01) | |
| *B08B 9/08* | (2006.01) | |
| *H01J 37/32* | (2006.01) | |
| *C23C 16/44* | (2006.01) | |

(52) U.S. Cl.
CPC .............. *B08B 3/08* (2013.01); *B08B 9/08* (2013.01); *C23C 16/4405* (2013.01); *H01J 37/32862* (2013.01); *C23C 16/4404* (2013.01)

(58) Field of Classification Search
CPC ......... B08B 3/08; B08B 9/08; C23C 16/4404; C23C 16/4405
See application file for complete search history.

(56) References Cited

U.S. PATENT DOCUMENTS

| | | | |
|---|---|---|---|
| 2005/0130427 A1 | 6/2005 | Won et al. | |
| 2006/0246741 A1* | 11/2006 | Ahn | C23C 16/405 438/785 |
| 2007/0065578 A1* | 3/2007 | McDougall | C23C 16/4404 427/248.1 |

* cited by examiner

*Primary Examiner* — Mikhail Kornakov
*Assistant Examiner* — Natasha N Campbell
(74) *Attorney, Agent, or Firm* — JCIPRNET (57) ABSTRACT

A method of cleaning a process chamber includes following steps. A plurality of process films and a plurality of non-process films are alternately formed on an interior surface of the process chamber. A cleaning operation is performed to remove the plurality of process films and the plurality of non-process films from the interior surface of the process chamber.

18 Claims, 12 Drawing Sheets

METHOD OF CLEANING PROCESS CHAMBER

BACKGROUND

In the fabrication of semiconductor integrated circuit (IC) devices, various device features such as insulation layers, metallization layers, passivation layers, etc., are formed on a semiconductor substrate. It is known that the quality of an IC device fabricated is a function of the processes in which these features are formed. The yield of an IC fabrication process, which in turn is a function of the quality of the device fabricated and a function of the cleanliness of the manufacturing environment in which the IC device is processed.

The ever increasing trend of miniaturization of semiconductor IC devices requires more stringent control of the cleanliness in the fabrication process and the process chamber in which the process is conducted. In recent years, contamination caused by particles or films has been reduced by the improvements made in the quality of clean rooms and by the increasing utilization of automated equipment which are designed to minimize exposure to human operators. However, even though contaminants from external sources have been reduced, various contaminating particles and films are still generated inside the process chamber during the processing of semiconductor wafers. Therefore, attention has been drawn to an effective chamber cleaning method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures. The apparatus may be otherwise oriented (rotated 90 degrees or at other orientations) and the spatially relative descriptors used herein may likewise be interpreted accordingly.

The present disclosure provides a novel method suitable for cleaning a process chamber. In some embodiments, the method of the present disclosure merely requires a single cleaning operation after multiple wafers are respectively deposited with process films in the chamber, and therefore, the chamber cleaning time can be significantly reduced because no chamber cleaning step is required between the deposition steps of two adjacent wafers.

More specifically, in some embodiments, the deposition step of a non-process film, instead of the conventional chamber cleaning step, is provided between the deposition steps of two adjacent wafers. In some embodiments, a process film indicates a functional film or a target film remained on a wafer, and a non-process film indicates a non-functional film or a season film not required for a wafer. When a process film is deposited on a wafer in a process chamber, the process film is also deposited on the interior surface of the process chamber. More specifically, a process film is deposited on the interior chamber surface when a wafer is processed in the chamber. On the contrary, a non-process film is deposited on the interior chamber surface when a wafer is not present in the chamber. In the process chamber, the non-process film is formed over the adjacent process film so as to adhere the process film to the interior surface and therefore prevent the films from contaminating a wafer that is being processed in the chamber. After multiple wafers are respectively deposited with process films in the chamber, the undesired process films and non-process films are removed from the interior surface of the process chamber by an extended cleaning operation.

Figure 1:
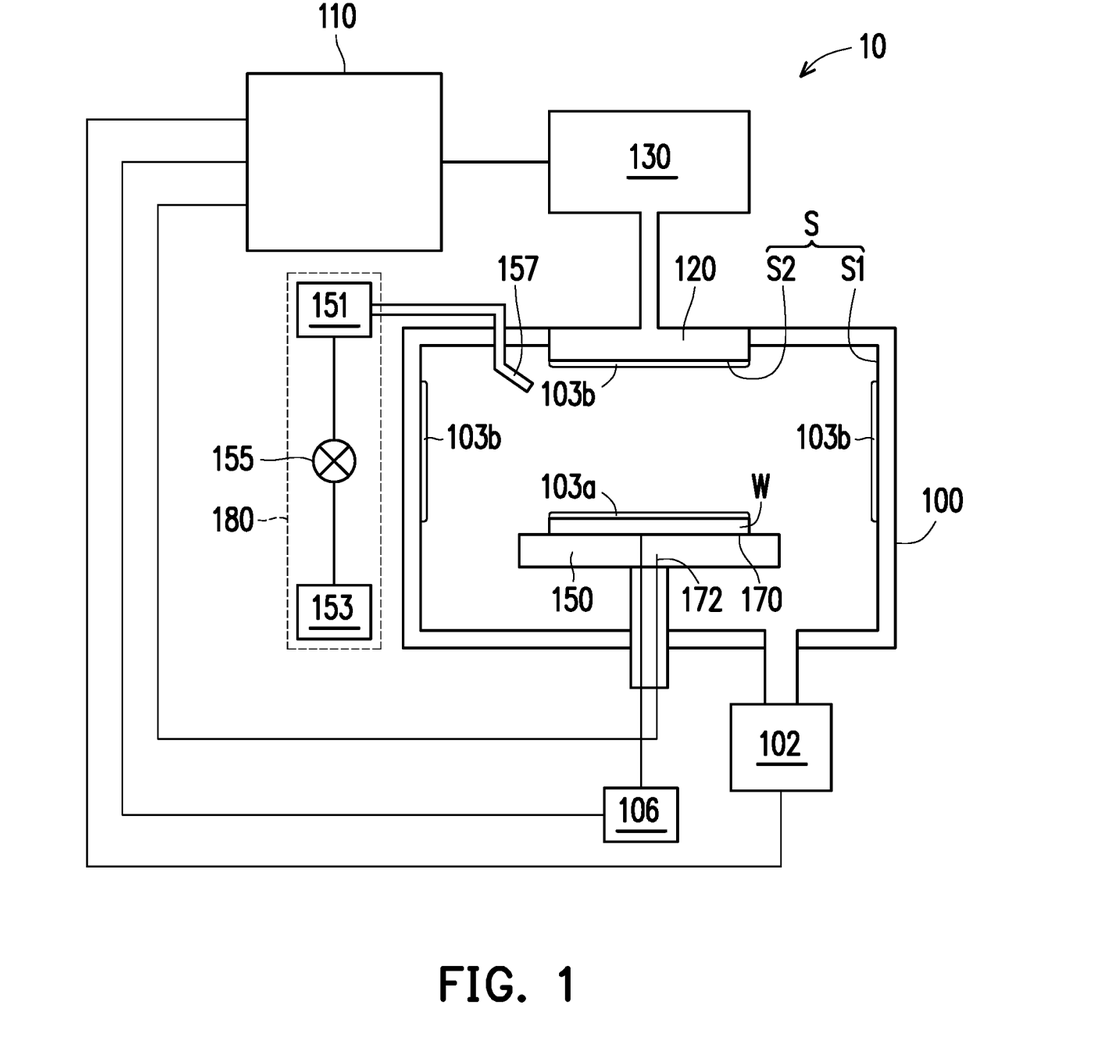
FIG. 1 is a schematic cross-sectional view of one embodiment of a process chamber in implementation of the present disclosure.

FIG. 1 is a schematic cross-sectional view of one embodiment of a process chamber in implementation of the present disclosure.

Referring to FIG. 1, a process chamber 10 may be used to deposit various material layers, such as low-k dielectric films, on multiple semiconductor wafers. It is understood that the process chamber 10 shown in FIG. 1 is merely one example of a CVD process chamber which is suitable for implementation of the present disclosure. Accordingly, the method of the present disclosure may be used to clean other process chambers having features which differ from those of the process chamber 10 shown in FIG. 1. For example, the method of the present disclosure may be used to clean an atomic layer deposition (ALD) process chamber.

In some embodiments, the process chamber 10 includes a chamber housing 100 which contains a wafer support pedestal 150. A heater element 170 may be embedded in the wafer support pedestal 150 for heating a wafer supported on the wafer support pedestal 150. An AC power supply 106 is typically connected to the heater element 170. A temperature sensor 172 is typically embedded in the wafer support pedestal 150 to monitor the temperature of the pedestal 150. The measured temperature is used in a feedback loop to control the power supplied to the heater element 170 through the AC power supply 106.

In some embodiments, the process chamber 10 further includes a gas distribution plate or a showerhead 120 provided in the top of the chamber housing 100. The showerhead 120 is configured for the introduction of process gases into the chamber housing 100. A gas panel 130, which is used to select the gases to be introduced into the chamber 10 through the showerhead 120, is connected to the showerhead 120. A vacuum pump 102 is operably connected to the chamber housing 100 to maintain proper gas flow and pressure inside the chamber housing 100, as well as to evacuate reactant by-products from the chamber housing 100.

A control unit 110 is operably connected to the gas panel 130 and to the various operational components of the chamber housing 100, such as the vacuum pump 102 and the AC power supply 106, to control a CVD process carried out in the chamber housing 100. Control of process gases flowing through the gas panel 130 is facilitated by mass flow controllers (not shown) and a microprocessor controller (not shown). In a CVD process, the showerhead 120 facilitates a uniform distribution of process gases over the surface of a wafer W supported on the wafer support pedestal 150.

The showerhead 120 and the wafer support pedestal 150 form a pair of spaced-apart electrodes in the chamber housing 100. When an electric field is generated between these electrodes, the process gases flowing into the chamber housing 100 through the showerhead 120 are ignited to form a plasma. Typically, the electric field is generated by connecting the wafer support pedestal 150 to a source of RF (radio frequency) power through a matching network (not shown). Alternatively, the RF power source and the matching network may be coupled to the showerhead 120 or to both the showerhead 120 and the wafer support pedestal 150.

A remote plasma source 180 may be coupled to the chamber housing 100 to provide a remotely-generated plasma to the chamber housing 100. The remote plasma source 180 includes a gas supply 153, a gas flow controller 155, a plasma chamber 151 and a chamber inlet 157. The gas flow controller 155 controls the flow of process gases from the gas supply 153 to the plasma chamber 151.

A remote plasma may be generated by applying an electric field to the process gas in the plasma chamber 151, creating a plasma of reactive species. Typically, the electric field is generated in the plasma chamber 151 using an RF power source (not shown). The reactive species generated in the remote plasma source 180 are introduced into the chamber housing 100 through the inlet 157.

During the operation of the process chamber 10, when a material layer 103a is deposited over a wafer W supported on the wafer support pedestal 150, material residues 103b gradually accumulate on the interior surface S of the process chamber 10. The interior surface S of the process chamber 10 includes surfaces of elements exposed to the reaction gases or precursors. In some embodiments, the interior surface S includes the surface S1 of the chamber housing 100 and the surface S2 of the showerhead 120. Particles from the material residues 103b have a tendency to break off and potentially contaminate devices being fabricated on subsequent wafers processed in the process chamber 10, and therefore, must be periodically removed from the interior surface S for optimum processing.

Figure 2:
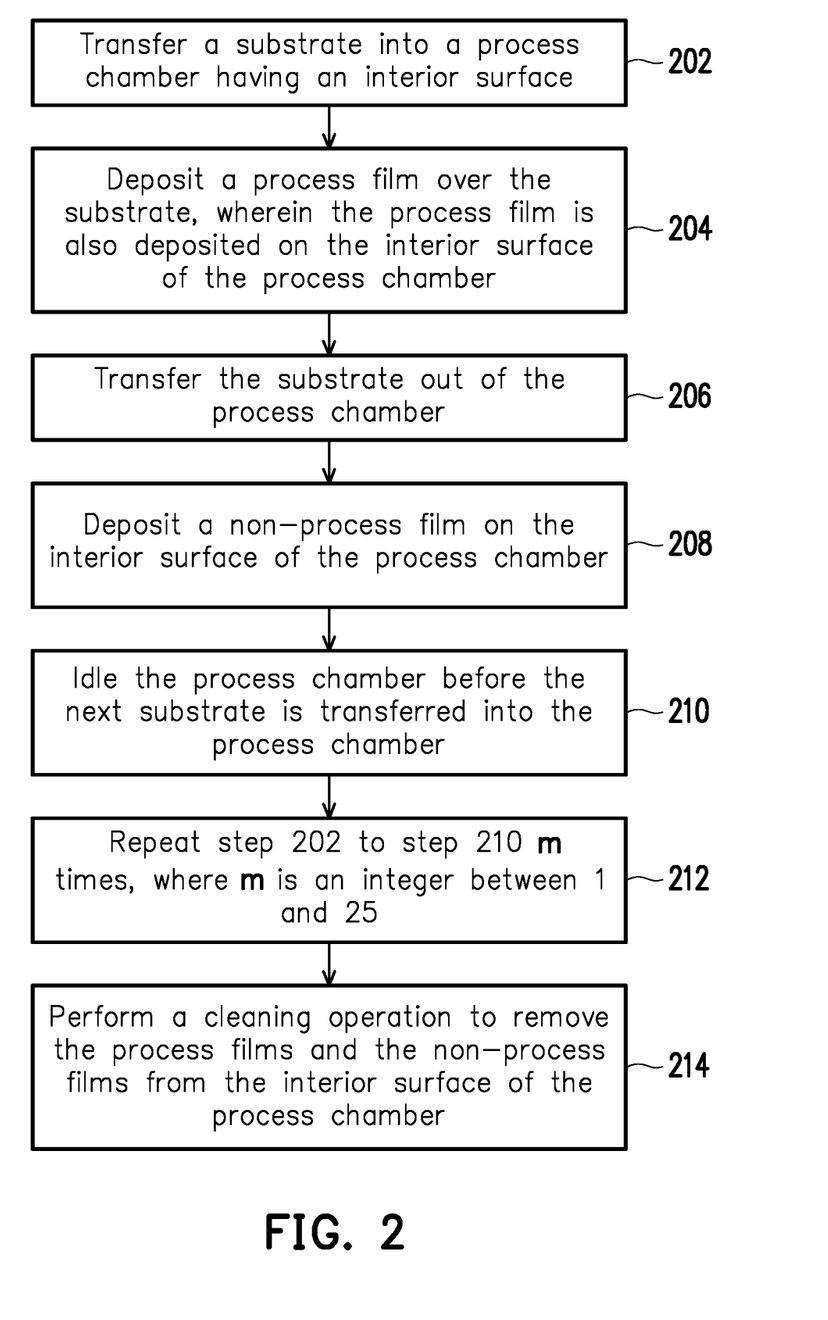
FIG. 2 is a flow chart of a method of cleaning a process chamber in accordance with some embodiments.

FIG. 2 is a flow chart of a method of cleaning a process chamber in accordance with some embodiments. FIG. 3A to FIG. 3F are schematic cross-sectional views of a method of cleaning a process chamber in accordance with some embodiments. FIG. 4 is a graph of sequence of pulses of different precursors in accordance with some embodiments. In some embodiments, the chamber cleaning method is applied to, for example but not limited to, the process chamber 10 of FIG. 1, in which some elements are omitted for the sake of clarity and convenience.

Figure 3A:
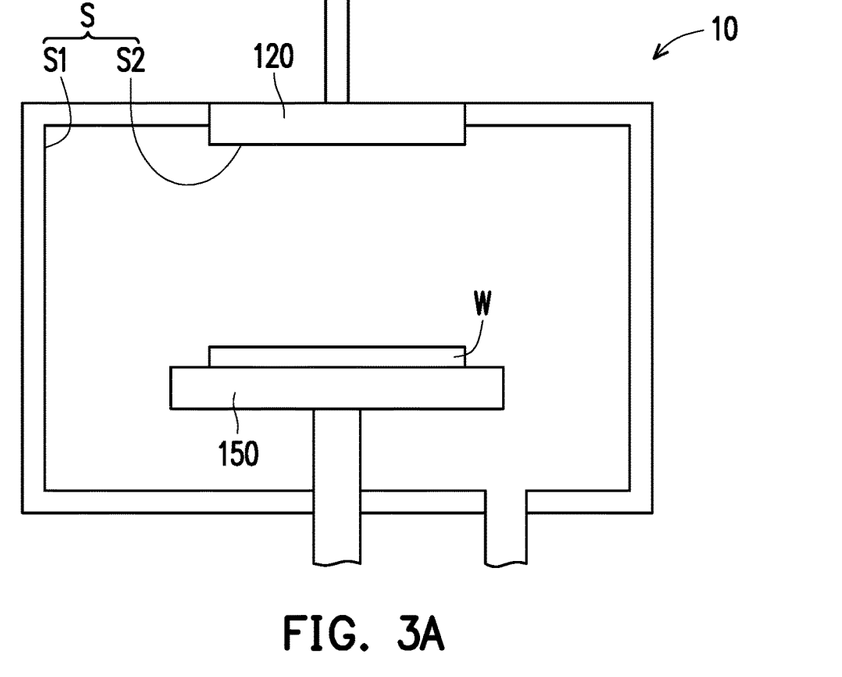
FIG. 3A to FIG. 3F are schematic cross-sectional views of a method of cleaning a process chamber in accordance with some embodiments.
Figure 4:
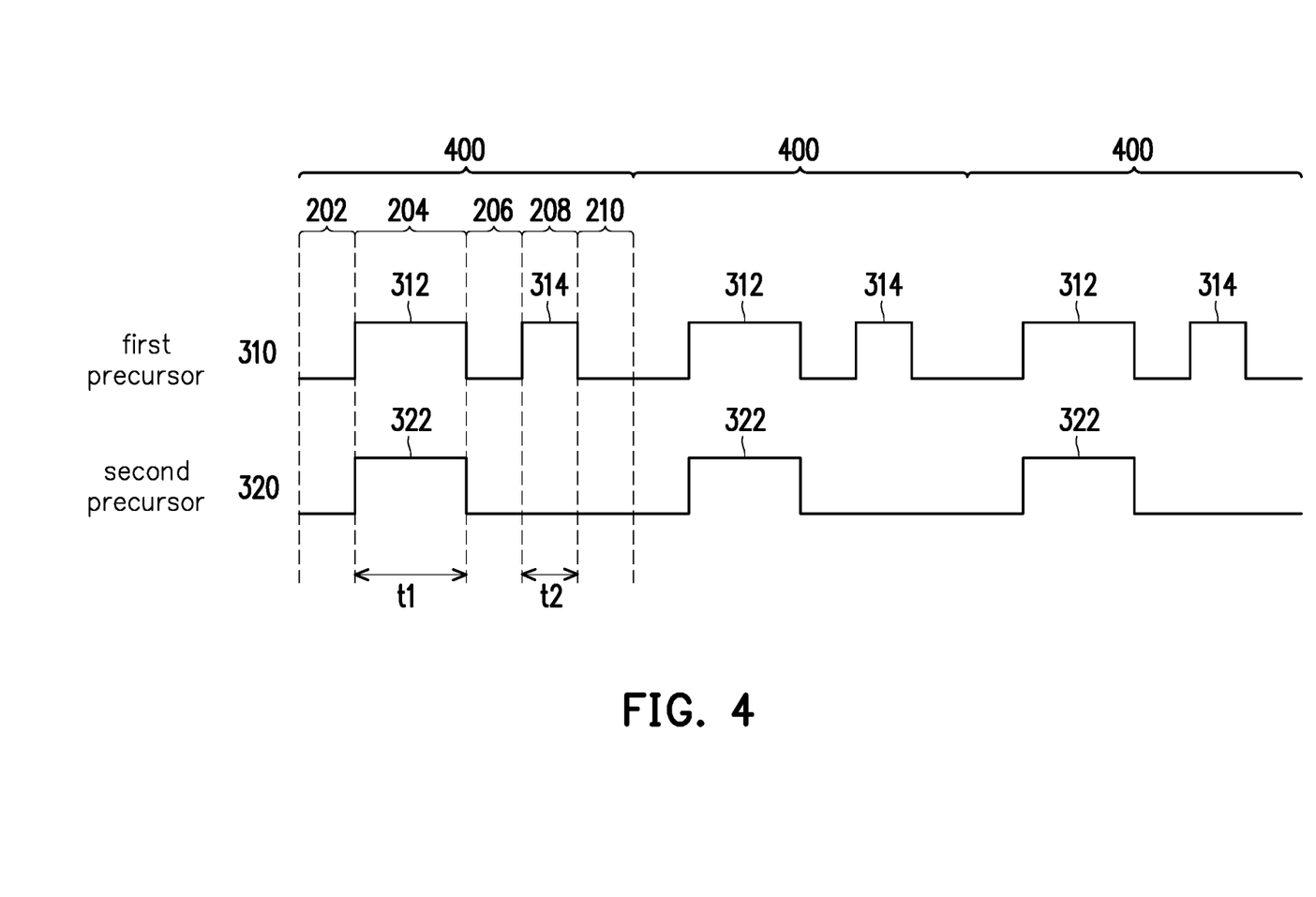
FIG. 4 is a graph of sequence of pulses of different precursors in accordance with some embodiments.

Referring to FIG. 2 and FIG. 3A, in step 202, a substrate or a wafer W is transferred into a process chamber 10 having an interior surface S. In some embodiments, in step 202, no precursor is introduced into the process chamber 10, as shown in FIG. 4.

Figure 3B:
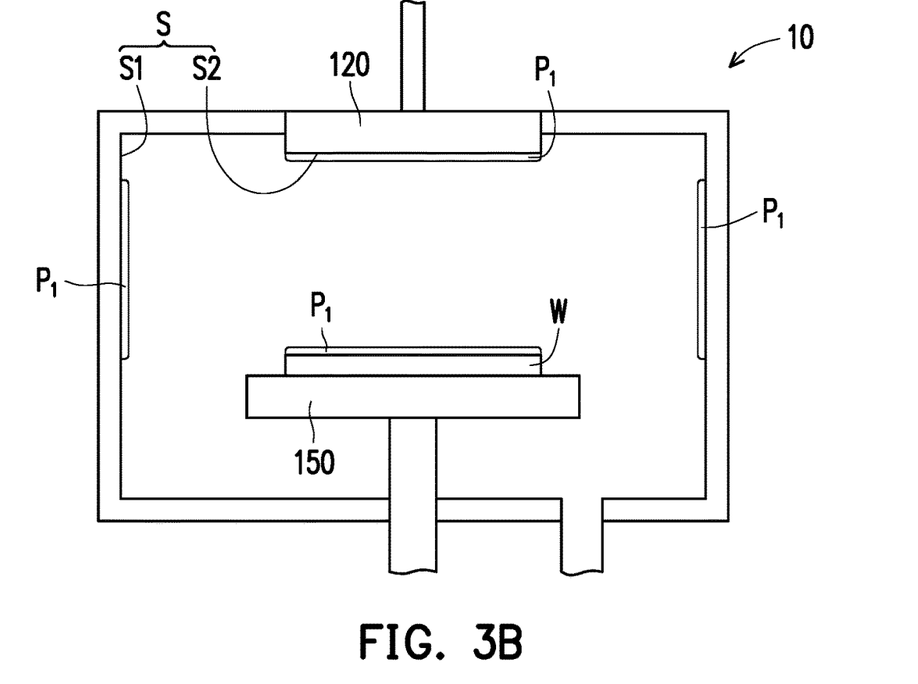

Referring to FIG. 2 and FIG. 3B, in step 204, a process film $P_1$ is formed over the substrate or the wafer W, and the process film $P_1$ is also deposited on the interior surface S of the process chamber 10. In some embodiments, in step 204, a first precursor 310 and a second precursor 320 are introduced into the process chamber 10 for a first time period t1, as shown in FIG. 4. In some embodiments, the first precursor is a film forming precursor or a dielectric matrix precursor, and the second precursor is a pore forming precursor or a porogen precursor. In some embodiments, the film forming precursor can be a silicon-rich precursor including methyl-diethoxysilane (MDEOS) or diethoxymethylsilane (DEMS), and the pore forming precursor can be a carbon-rich precursor including alpha-terpinene (ATRP), ethylene ($C_2H_4$) or a chemical corresponding to the general formula $(CH_3)_2CHC_6H_6$—$C_nH_{2n+1}$ (n is a positive integer).

In some embodiments, the process film $P_1$ is a porous organosilicate glass (OSG) film deposited using a DEMS structure forming precursor and an ATRP pore forming precursor. In some embodiments, the process film $P_1$ is a porous low-k layer having a dielectric constant of about 3.0 or less, about 2.6 or less, or about 2.0 or less.

Figure 3C:
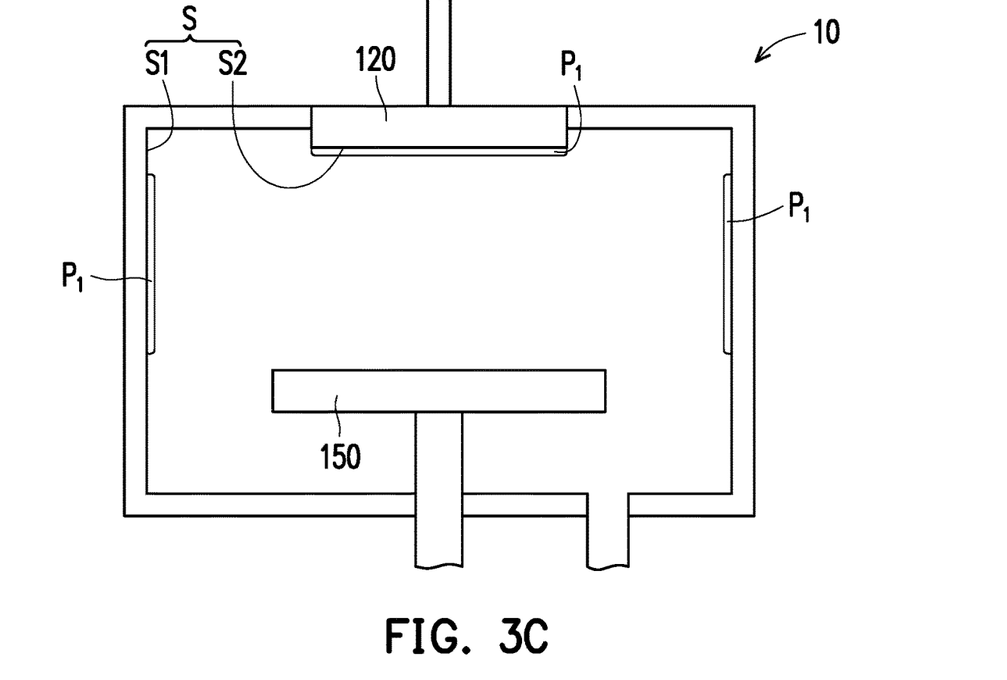

Referring to FIG. 2 and FIG. 3C, in step 206, the substrate or the wafer W is transferred out of the process chamber 10. In some embodiments, in step 206, no precursor is introduced into the process chamber 10, as shown in FIG. 4.

Figure 3D:
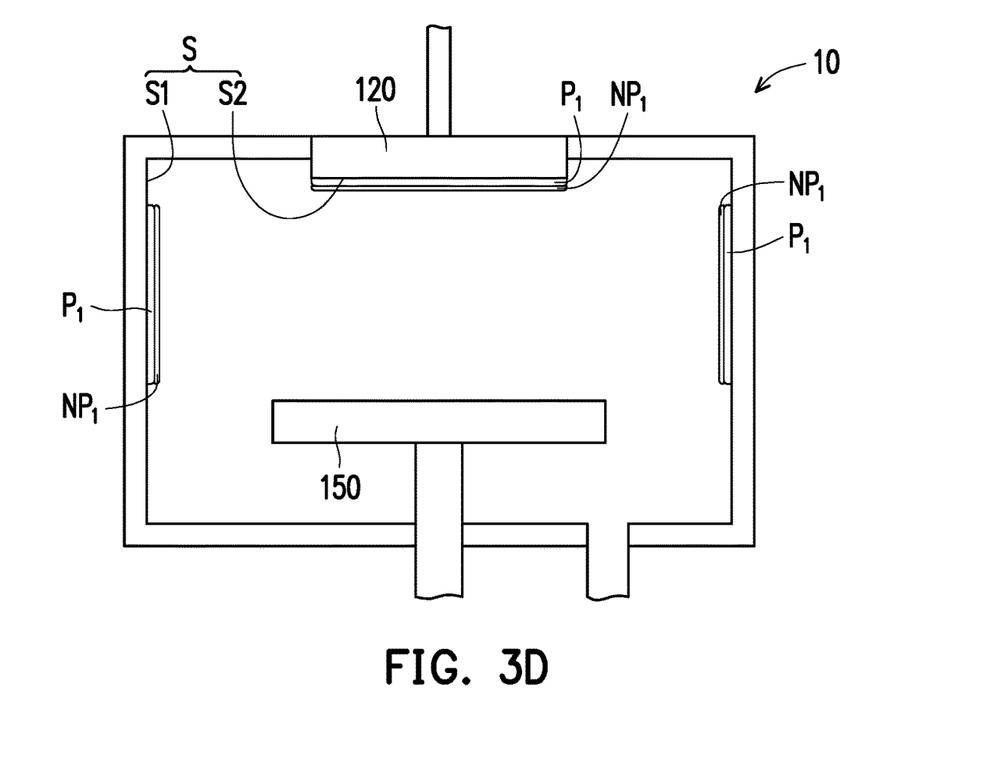

Referring to FIG. 2 and FIG. 3D, in step 208, a non-process film $NP_1$ is deposited on the interior surface S of the process chamber 10. Specifically, the non-process film $NP_1$ is deposited over the process film $P_1$ on the interior surface S of the process chamber 10, so as to adhere the process film $P_1$ to the interior surface S and therefore prevent the films from contaminating a wafer that is being processed in the chamber. In some embodiments, in step 208, the second precursor 320 is not introduced into the process chamber 10, while the first precursor 310 is introduced into the process chamber 10 for a second time period t2, as shown in FIG. 4. In some embodiments, the first time period t1 is different from (e.g., greater than) the second time period t2, but the disclosure is not limited thereto. In alternative embodiments, the first time period t1 is substantially the same as the second time period t2. In some embodiments, the process film $P_1$ and the non-process film $NP_1$ are formed at the same process chamber temperature.

In some embodiments, the non-process film $NP_1$ is a substantially non-porous organosilicate glass (OSG) film deposited using a DEMS structure-former precursor. In some embodiments, the non-process film $NP_1$ has a dielectric constant greater than that of the process film $P_1$. In some embodiments, the non-process film $NP_1$ has a dielectric constant of more than about 2.6, and preferably more than about 3.0.

Thereafter, in step 210, the process chamber 10 is idled for an idle time period before the next substrate or wafer is transferred into a process chamber 10. In some embodiments, in step 210, no precursor is introduced into the process chamber 10, as shown in FIG. 4.

Figure 3E:
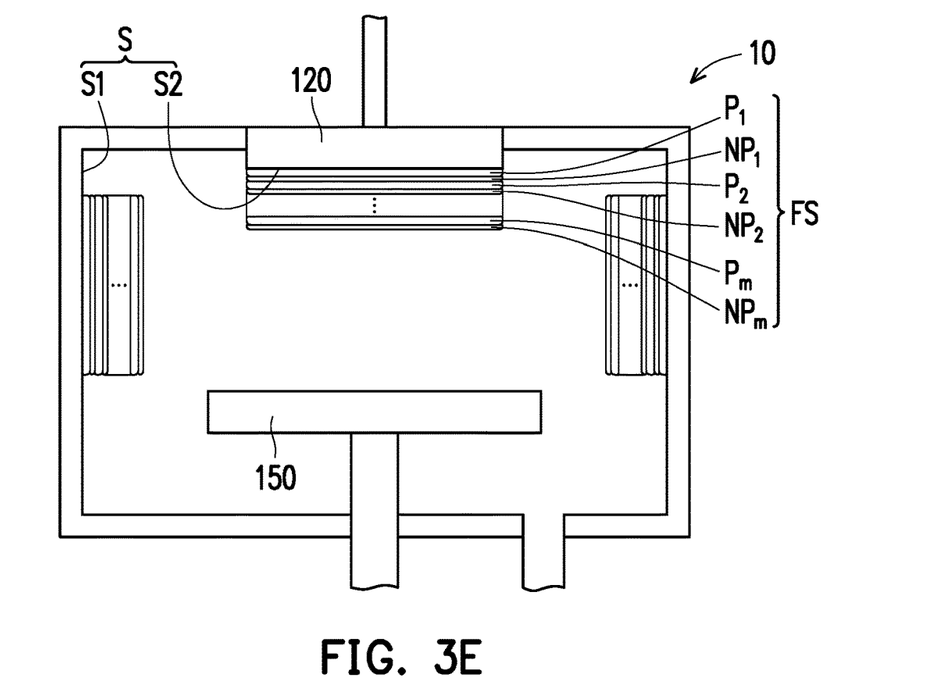

Referring to FIG. 2 and FIG. 3E, in step 212, step 202 to step 210 are repeated m times, where m is an integer between 1 and 25, between 3 and 13, or between 6 and 10. In some embodiments, m indicates the number of wafers processed in the process chamber 10. After m wafers are processed in the process chamber 10, process films $P_1$ to $P_m$ and non-process films $NP_1$ to $NP_m$ are alternately deposited on the interior surface S of the process chamber 10. In some embodiments, the process films $P_1$ to $P_m$ and the non-process films $NP_1$ to $NP_m$ constitute a film stack FS on the interior surface S of the process chamber 10.

In some embodiments, step 202 to step 210 constitute a deposition cycle 400 of the process chamber 10. Multiple deposition cycles 400 are performed until the predetermined number of wafers are respectively completed with their deposition steps. In some embodiments, there is no cleaning step between any two of step 202 to step 212. In some embodiments, there is no cleaning step in the repeating step 212.

Figure 3F:
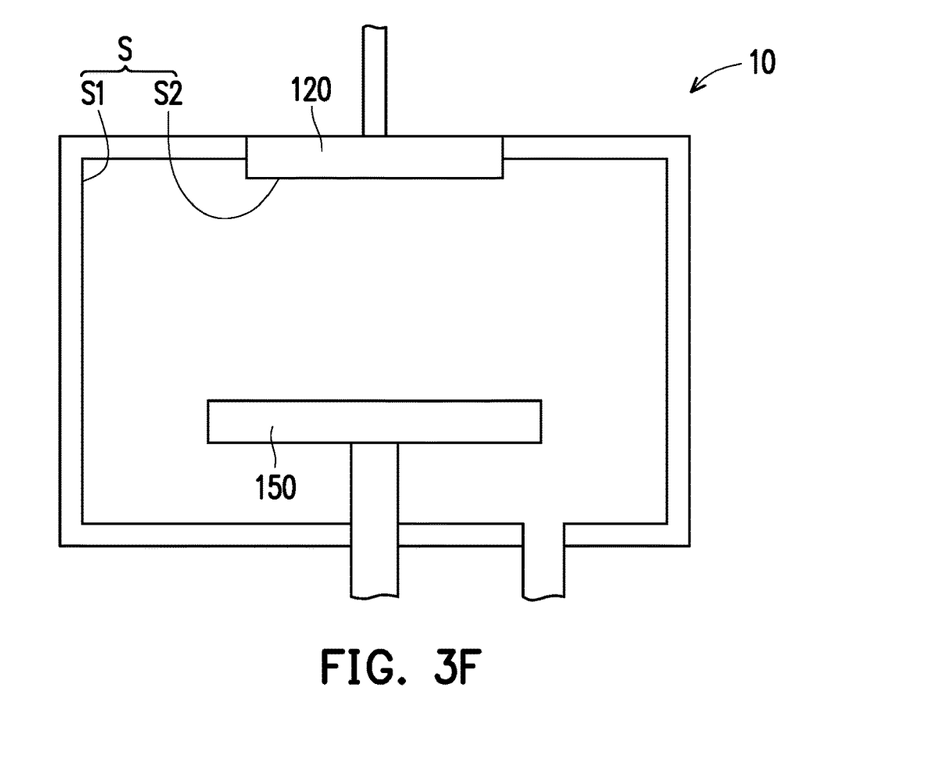

Referring to FIG. 2 and FIG. 3F, in step 214, a cleaning operation is performed to remove the process films $P_1$ to $P_m$ and the non-process films $NP_1$ to $NP_m$ from the interior surface S of the process chamber 10. In some embodiments, the cleaning gas for the cleaning operation includes a fluorine source. The fluorine source includes $NF_3$, $F_2$, $SF_6$, $CF_4$, $C_2F_6$, $C_3F_8$ or a combination thereof. In some embodiments, the cleaning gas for the cleaning operation further includes an inert gas, such as argon, helium or a combination thereof.

In the present disclosure, the deposition step of a non-process film, instead of the conventional chamber cleaning step, is provided between the deposition steps of process films of two adjacent wafers. The non-process film helps to adhere the underlying process film to the interior surface of the process chamber, and therefore prevents the film stack from peeling and contaminating a wafer that is processed in the chamber. The method of the present disclosure merely requires a single cleaning operation after multiple wafers are respectively deposited with process films in the chamber, and therefore, the chamber cleaning time can be significantly reduced.

Figure 5:
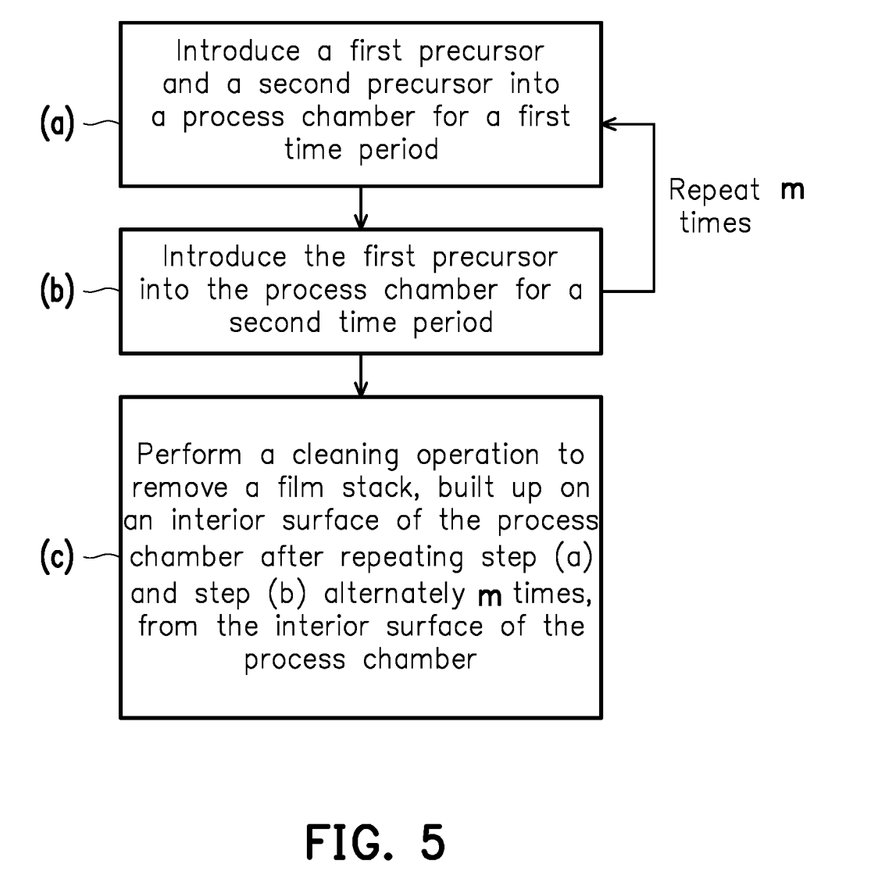
FIG. 5 is a flow chart of a method of cleaning a process chamber in accordance with alternative embodiments.

In some embodiments, the present disclosure further provides a method of cleaning a process chamber as shown in FIG. 5 with reference to FIG. 4 and FIGS. 6-8.

Referring FIG. 4 and FIG. 5, step (a) of introducing a first precursor 310 and a second precursor 320 into a process chamber 10 for a first time period t and step (b) of introducing the first precursor 310 into the process chamber 10 for a second time period t2 are repeated alternately m times (m is an integer between 1 and 25), and a film stack is built up on an interior surface S of the process chamber 10 after step (a) and step (b) are repeated m times. In some embodiments, the film stack includes process films and non-process films alternatively stacked on the interior surface S of the process chamber 10.

Figure 6:
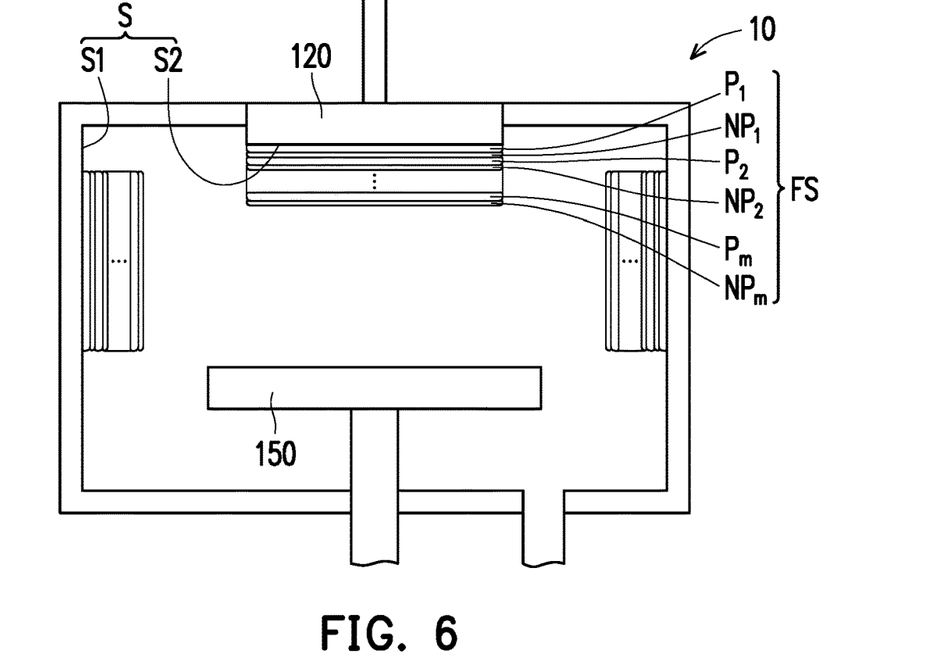
FIG. 6 is a schematic cross-sectional view of a stage of a process chamber immediately before cleaning the process chamber in accordance with some embodiments.

In some embodiments, step (a) is first performed in the repeating step, and the film stack FS built up on an interior surface S of the process chamber 10 is shown in FIG. 6. Specifically, a process film $P_1$ is first formed in the repeating step and is in contact with the interior surface S of the process chamber 10.

Figure 7:
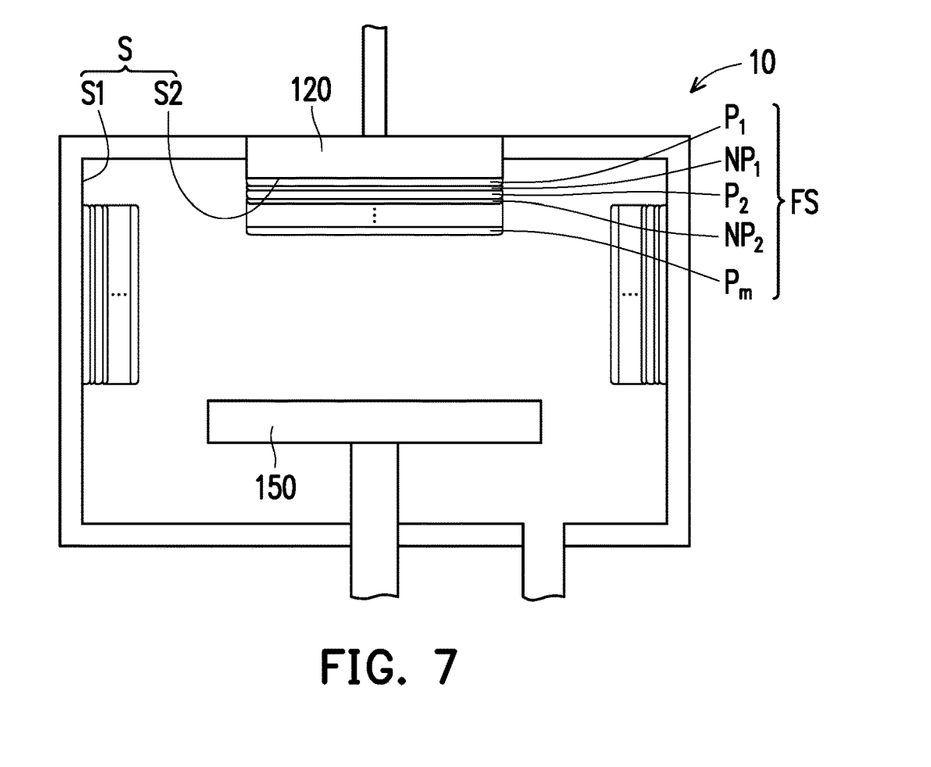
FIG. 7 is a schematic cross-sectional view of a stage of a process chamber immediately before cleaning the process chamber in accordance with alternative embodiments.

In alternative embodiments, step (a) is last performed in the repeating step, and the film stack FS built up on an interior surface S of the process chamber 10 is shown in FIG. 7. Specifically, a process film $P_m$ is last formed in the repeating step. After the process film $P_m$ is formed, the wafer is transferred out of the process chamber, and the process chamber is then immediately subjected to a cleaning operation.

Figure 8:
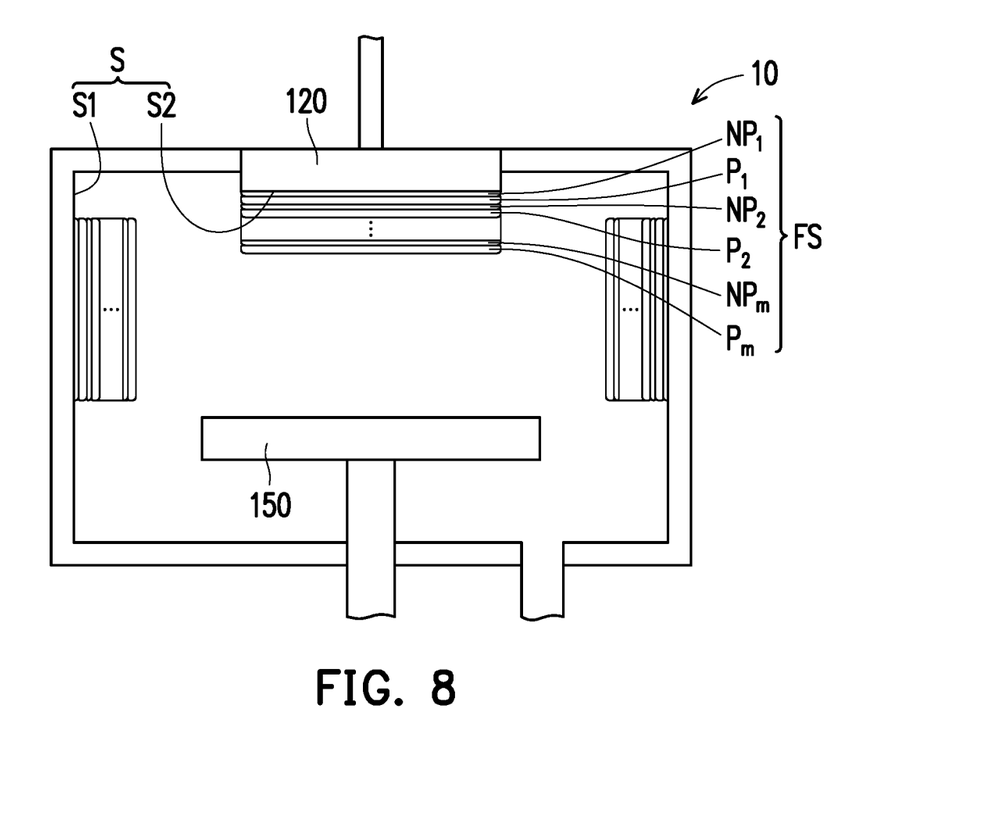
FIG. 8 is a schematic cross-sectional view of a stage of a process chamber immediately before cleaning the process chamber in accordance with yet alternative embodiments.

In yet alternative embodiments, step (b) is first performed in the repeating step, and the film stack FS built up on an interior surface S of the process chamber 10 is shown in FIG. 8. Specifically, a non-process process film is first formed in the repeating step and is in contact with the interior surface S of the process chamber 10.

After multiple wafers are respectively deposited with their process films in the same chamber, as shown in step (c) of FIG. 5, a cleaning operation is performed to remove the film stack (as shown FIG. 6, FIG. 7 or FIG. 8) from the interior surface S of the process chamber 10. In some embodiments, the cleaning gas for the cleaning operation includes a fluorine source, an inert gas or a combination thereof.

Figure 9:
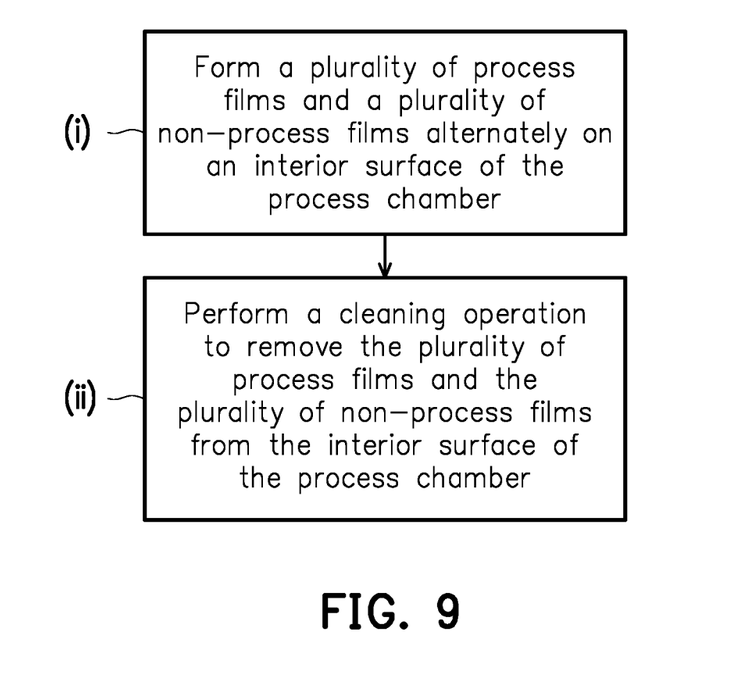
FIG. 9 is a flow chart of a method of cleaning a process chamber in accordance with alternative embodiments.

In some embodiments, the present disclosure also provides a method of cleaning a process chamber as shown in FIG. 9 with reference to FIG. 4 and FIGS. 6-8.

Referring to FIGS. 6-9, in step (i), a plurality of process films and a plurality of non-process films are formed alternately on an interior surface S of the process chamber 10.

In some embodiments, as shown in FIG. 4, the method of forming the process films and the non-process films includes introducing first pulses 312 and 314 of a first precursor 310 into the process chamber 10, and introducing second pulses 322 of a second precursor 320 into the process chamber 10. In some embodiments, the first pulses 312 and 314 of the first precursor 310 partially overlap with the second pulses 322 of the second precursor 320. For example, the first pulses 312 of the first precursor 310 overlapping with the second pulses 322 of the second precursor 320 and the first pulses 314 of the first precursor 310 not overlapping with the second pulses 322 of the second precursor 320 are arranged alternately. In some embodiments, the first precursor 310 is a film forming precursor, and the second precursor 320 is a pore forming precursor. In some embodiments, the process chamber temperature keeps constant during the formation of the process films and the non-process films.

In some embodiments, the dielectric constant of the process films is different from (e.g., less than) the dielectric constant of the non-process films. In some embodiments, the dielectric constant of the process films is about 3.0 or less, and the dielectric constant of the non-process films is greater than about 3.0 and less than about 4.0. In alternative embodiments, the dielectric constant of the process films is about 2.5 or less, and the dielectric constant of the non-process films is greater than about 2.5. In yet alternative embodiments, the dielectric constant of the process films is about 2.0 or less, and the dielectric constant of the non-process films is greater than about 2.0.

In some embodiments, the porosity of the process films is different from (e.g., greater than) the porosity of the non-process films. In some embodiments, the process films are porous dielectric layers, and the non-process films are pore-free dielectric layers.

In some embodiments, the process films have a stress different from (e.g., greater than) the stress of the non-process films. In some embodiments, the process films are tensile dielectric layers, and the non-process films are compressive dielectric layers. The non-process films help to relieve the stress of the process films on the interior surface of the process chamber.

In some embodiments, a process film and a non-process film adjacent to the process film are in a thickness ratio of about 1:1 to 10:1. For example, the process film and the non-process film adjacent to the process film are in a thickness ratio of about 3:1 to 4:1. By controlling and adjusting the above thickness ratio within the range of the disclosure, the film stack can be stably adhered to the interior chamber surface before a chamber cleaning operation, and can be easily removed during the chamber cleaning operation.

After multiple wafers are respectively deposited with their process films in the same chamber, as shown in step (ii) of FIG. 9, a cleaning operation is performed to remove the process films and the non-process films from the interior surface S of the process chamber 10. In some embodiments, the cleaning gas for the cleaning operation includes a fluorine source, an inert gas or a combination thereof.

The above embodiments in which two precursors are used in the chamber cleaning process are provided for illustration purposes, and are not construed as limiting the present disclosure. In some embodiments, more than two precursors can be used in the chamber cleaning process.

Figure 10:
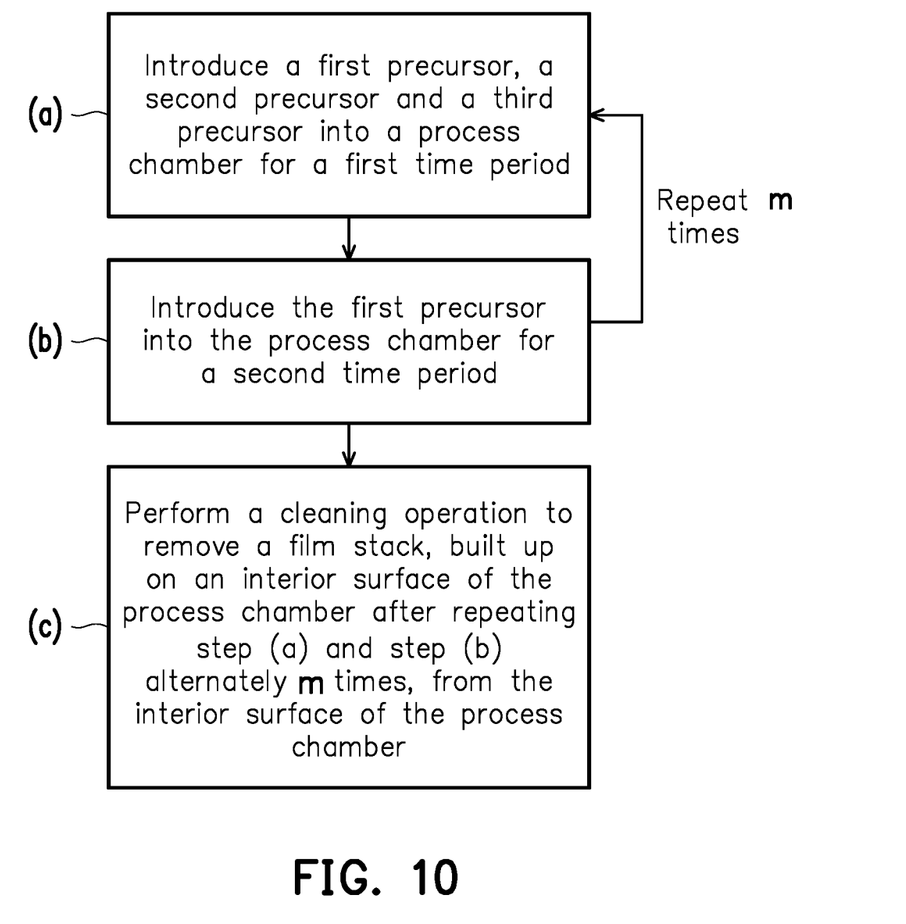
FIG. 10 is a flow chart of a method of cleaning a process chamber in accordance with yet alternative embodiments.
Figure 11:
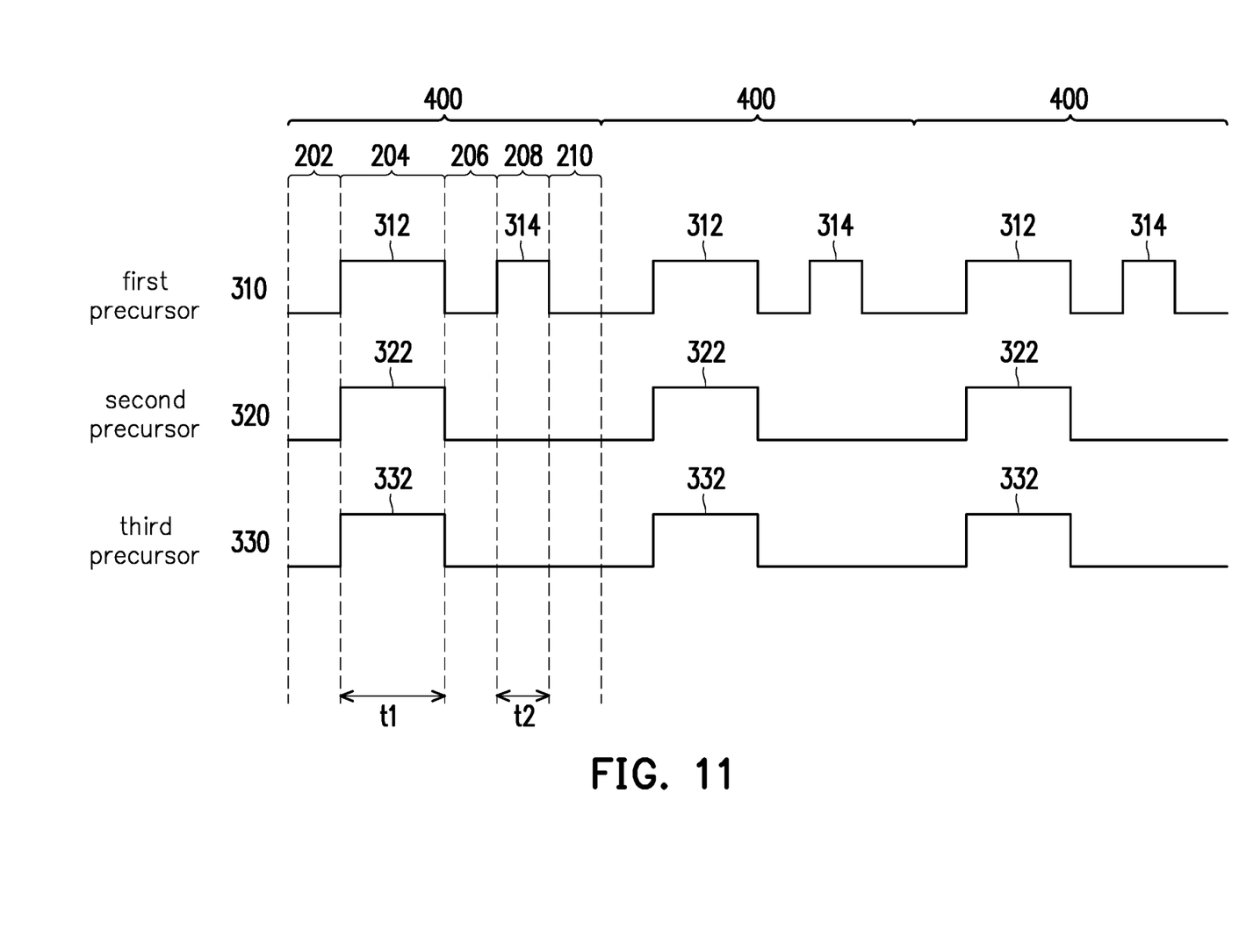
FIG. 11 is a graph of sequence of pulses of different precursors in accordance with yet alternative embodiments.

In some embodiments, the present disclosure further provides a method of cleaning a process chamber as shown in FIG. 10 and FIG. 11.

Referring FIG. 10 and FIG. 11, step (a) of introducing a first precursor 310, a second precursor 320 and a third precursor 330 into a process chamber 10 for a first time period t1 and step (b) of introducing the first precursor 310 into the process chamber 10 for a second time period t2 are repeated alternately m times (m is an integer between 1 and 25), and a film stack is built up on an interior surface S of the process chamber 10 after step (a) and step (b) are repeated m times. In some embodiments, the film stack includes process films and non-process films alternatively stacked on the interior surface S of the process chamber 10.

Specifically, the method of forming the process films and the non-process films includes introducing first pulses 312 and 314 of a first precursor 310 into the process chamber 10, introducing second pulses 322 of a second precursor 320 into the process chamber 10, and introducing third pulses 332 of a third precursor 330 into the process chamber 10. In some embodiments, the first pulses 312 and 314 of the first precursor 310 partially overlap with the second pulses 322 of the second precursor 320 and the third pulses 332 of the third precursor 330. For example, the first pulses 312 of the first precursor 310 overlapping with the second/third pulses 322/332 of the second/third precursor 320/330 and the first pulses 314 of the first precursor 310 not overlapping with the second/third pulses 322/332 of the second/third precursor 320/330 are arranged alternately. In some embodiments, the first precursor 310 is a film forming precursor, the second precursor 320 is a pore forming precursor, and the third precursor 330 is another pore forming precursor. In some embodiments, the first precursor 310 can be a silicon-rich precursor including methyldiethoxysilane (MDEOS) or diethoxymethylsilane (DEMS), and each of the second precursor 320 and the third precursor 330 can be a carbon-rich precursor including alpha-terpinene (ATRP), ethylene ($C_2H_4$) or a chemical corresponding to the general formula $(CH_3)_2CHC_6H_6$—$C_nH_{2n+1}$ (n is a positive integer).

After multiple wafers are respectively deposited with their process films in the same chamber, as shown in step (c) of FIG. 10, a cleaning operation is performed to remove the film stack from the interior surface S of the process chamber 10. In some embodiments, the cleaning gas for the cleaning operation includes a fluorine source, an inert gas or a combination thereof.

In view of the above, in the present disclosure, the deposition step of a non-process film, instead of the conventional chamber cleaning step, is provided between the deposition steps of process films of two adjacent wafers. The non-process films help to adhere the process films to the interior surface of the process chamber, and therefore prevent the film stack from peeling and contaminating a wafer that is processed in the chamber. After multiple wafers are respectively deposited with their process films in the same chamber, an extended cleaning operation is performed to completely remove the process films and non-process films from the interior surface of the process chamber. By such manner, the chamber cleaning time is significantly reduced, and the volume or throughput of wafers is greatly increased.

In accordance with some embodiments of the present disclosure, a method of cleaning a process chamber includes the following steps. A plurality of process films and a plurality of non-process films are alternately formed on an interior surface of the process chamber. A cleaning operation is performed to remove the plurality of process films and the plurality of non-process films from the interior surface of the process chamber.

In accordance with alternative embodiments of the present disclosure, a method of cleaning a process chamber includes the following steps. Step (a) of introducing a first precursor and a second precursor into a process chamber for a first time period and step (b) of introducing the first precursor into the process chamber for a second time period are repeated alternately m times, wherein m is an integer between 1 and 25, and a film stack is built up on an interior surface of the process chamber after step (a) and step (b) are repeated m times. A cleaning operation is then performed to remove the film stack from the interior surface of the process chamber In accordance with yet alternative embodiments of the present disclosure, a method of cleaning a process chamber includes the following steps. A substrate is transferred into a process chamber having an interior surface. Thereafter, a process film is deposited over the substrate, wherein the process film is also deposited on the interior surface of the process chamber. Afterwards, the substrate is transferred out of the process chamber. Next, a non-process film is deposited on the interior surface of the process chamber. The above steps are repeated m times, where m is an integer between 1 and 25. A cleaning operation is then performed to remove the process films and the non-process films from the interior surface of the process chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of cleaning a process chamber, comprising:
forming a plurality of process films and a plurality of non-process films alternately on an interior surface of the process chamber; and
performing a cleaning operation to remove the plurality of process films and the plurality of non-process films from the interior surface of the process chamber;
wherein a porosity of the plurality of process films is greater than a porosity of the plurality of non-process films.

2. The method of claim 1, wherein forming the plurality of process films and the plurality of non-process films comprises:
introducing first pulses of a first precursor into the process chamber; and
introducing second pulses of a second precursor into the process chamber,
wherein the first pulses of the first precursor partially overlap with the second pulses of the second precursor.

3. The method of claim 2, wherein the first pulses of the first precursor overlapping with the second pulses of the second precursor and the first pulses of the first precursor not overlapping with the second pulses of the second precursor are arranged alternately.

4. The method of claim 1, wherein a process chamber temperature keeps constant when forming the plurality of process films and the plurality of non-process films.

5. The method of claim 1, wherein a dielectric constant of the plurality of process films is different from a dielectric constant of the plurality of non-process films.

6. The method of claim 5, wherein the dielectric constant of the plurality of process films is less than the dielectric constant of the plurality of non-process films.

7. The method of claim 1, wherein a process film and a non-process film adjacent to the process film are in a thickness ratio of 1:1 to 10:1.

8. The method of claim 1, wherein a dielectric constant of the plurality of process films is 3.0 or less.

9. A method of cleaning a process chamber, comprising:
repeating (a) introducing a first precursor and a second precursor into a process chamber for a first time period and (b) introducing the first precursor into the process chamber for a second time period alternately in times, wherein in is an integer between 1 and 25, and a film stack is built up on an interior surface of the process chamber after step (a) and step (b) are repeated in times; and
performing a cleaning operation to remove the film stack from the interior surface of the process chamber,
wherein the first precursor is a film forming precursor, and the second precursor is a pore forming precursor.

10. The method of claim 9, wherein step (a) is first performed in the repeating step.

11. The method of claim 9, wherein step (a) is last performed in the repeating step.

12. The method of claim 9, wherein step (b) is first performed in the repeating step.

13. The method of claim 9, wherein no cleaning step is performed in the repeating step.

14. The method of claim 9, further comprising introducing a third precursor into the process chamber in step (a).

15. The method of claim 14, wherein the first precursor is a film forming precursor, the second precursor is a pore forming precursor, and the third precursor is another pore forming precursor.

16. The method of claim 9, wherein the first time period is different from the second time period.

17. A method of cleaning a process chamber, comprising:
(1) transferring a substrate into a process chamber having an interior surface;
(2) depositing a process film over the substrate, wherein the process film is also deposited on the interior surface of the process chamber;
(3) transferring the substrate out of the process chamber;
(4) depositing a non-process film on the interior surface of the process chamber;
(5) repeating (1)-(4) m times to form the process films and the non-process films alternately, where m is an integer between 1 and 25; and
(6) performing a cleaning operation to remove the process films and the non-process films from the interior surface of the process chamber,
wherein a porosity of the process films is greater than a porosity of the non-process films.

18. The method of claim 17, wherein no cleaning step is performed in the repeating step (5).

* * * * *